United States Patent [19]
Haslam et al.

[11] Patent Number: 5,593,920
[45] Date of Patent: Jan. 14, 1997

[54] METHOD FOR FORMING CONTACT STRUCTURES IN INTEGRATED CIRCUITS

[75] Inventors: Michael E. Haslam, Highland Village; Charles R. Spinner, III, Dallas, both of Tex.

[73] Assignee: SGS-Thomson Microelectronics, Inc., Carrollton, Tex.

[21] Appl. No.: 226,672

[22] Filed: Apr. 12, 1994

Related U.S. Application Data

[62] Division of Ser. No. 876,953, Apr. 30, 1992, Pat. No. 5,331,116.

[51] Int. Cl.$^6$ .................................................. H01L 21/441
[52] U.S. Cl. ........................... 437/195; 437/246; 437/922
[58] Field of Search .................................... 437/195, 922, 437/246; 148/DIG. 55

[56] References Cited

U.S. PATENT DOCUMENTS

| | | | |
|---|---|---|---|
| 5,015,599 | 5/1991 | Verhaar | 437/191 |
| 5,026,663 | 6/1991 | Zdebel et al. | 437/233 |
| 5,070,391 | 12/1991 | Liou et al. | 257/750 |
| 5,091,763 | 2/1992 | Sanchez | 437/41 |
| 5,106,773 | 4/1992 | Chen et al. | 437/922 |
| 5,166,556 | 11/1992 | Hsu et al. | 437/922 |
| 5,171,715 | 12/1992 | Husher et al. | 148/DIG. 55 |
| 5,225,040 | 7/1993 | Rohner | 437/246 |

FOREIGN PATENT DOCUMENTS

| | | | |
|---|---|---|---|
| 59112656 | 6/1984 | Japan | 437/157 |

*Primary Examiner*—Charles L. Bowers, Jr.
*Assistant Examiner*—Michael Trinh
*Attorney, Agent, or Firm*—Theodore E. Galanthay; Kenneth C. Hill; Lisa K. Jorgenson

[57] ABSTRACT

A structure and method for forming contact structures in integrated circuits. A buffer layer is formed over an underlying conductive element. A first conductive layer is then deposited over the buffer layer and patterned to define a first interconnect layer. While the first interconnect layer is patterned, the buffer layer protects the underlying conductive element from damage. Portions of the buffer layer which are not covered by the first interconnect layer are then removed, and a second conductive layer is deposited over the integrated circuit. The second conductive layer is then anisotropically etched to form conductive sidewall spacers alongside the vertical sidewalls of the first interconnect layer, where at least one of the conductive sidewall spacers makes electrical contact with the underlying conductive element. Therefore, a conductive contact is made between the underlying conductive element and the first interconnect layer through at least one of the conductive sidewall spacers.

7 Claims, 2 Drawing Sheets

METHOD FOR FORMING CONTACT STRUCTURES IN INTEGRATED CIRCUITS

This is a Division of application Ser. No. 07/876,953, filed Apr. 30, 1992, now U.S. Pat. No. 5,331,116.

BACKGROUND OF THE INVENTION

1. Field of the Invention

The present invention relates generally to fabrication of semiconductor integrated circuits, and more particularly to a structure and method for fabricating contact structures in integrated circuits.

2. Description of the Prior Art

Conductive interconnect layers typically have an enlarged area in the layer itself at a location where a contact is to be made from a later formed interconnect layer. Those skilled in the art commonly call the enlarged area the enclosure. Recognizing that errors in mask alignment can shift a contact from a desired location, the enclosure accounts for the errors in mask alignment by providing additional contact space. Thus, the enclosure ensures a contact will be made to an underlying interconnect layer.

A conflict arises, however, between the need for enclosures and the desire to reduce the chip sizes in integrated circuits. Those skilled in the art will recognize that there must be a minimum amount of space between adjacent conductive elements. Enclosures in an interconnect layer force the distance between adjacent conductive elements to increase in order to maintain the minimum distance between the adjacent conductive elements. Thus, the need for enclosures places restrictions on how small the size of an integrated circuit can be.

Errors in mask alignment can also cause problems during formation of the interconnect layers. Interconnect layers can be formed directly above an underlying conductive element, where ideally, the interconnect layer completely covers the underlying conductive element. Errors in mask alignment, however, allow for placement of the interconnect layer to shift from the desired location, causing a portion of the underlying conductive element to be exposed. During formation of the interconnect layer the underlying conductive element may be damaged as a result of the exposure. Damage to the conductive element can affect the reliability of the integrated circuit.

Therefore, it would be desirable to provide a method for forming contact structures which protects underlying conductive elements from damage during formation of interconnect layers. It is also desirable that such a method result in contact structures which are free from voids or other defects. Finally, it is desirable that such a method eliminate the need for enclosures in interconnect layers.

SUMMARY OF THE INVENTION

A structure and method are provided for forming contact structures in integrated circuits. A buffer layer is formed over an underlying conductive element. The buffer layer may or may not be a conductive film. A first conductive layer is then deposited over the buffer layer and patterned to define a first interconnect layer. While the first interconnect layer is patterned, the buffer layer protects the underlying conductive element from damage. Portions of the buffer layer which are not covered by the first interconnect layer are then removed, and a second conductive layer is deposited over the integrated circuit. The second conductive layer is then anisotropically etched to form conductive sidewall spacers alongside the vertical sidewalls of the first interconnect layer, where at least one of the conductive sidewall spacers makes electrical contact with the underlying conductive element. Therefore, a conductive contact is made between the underlying conductive element and the first interconnect layer through at least one of the conductive sidewall spacers. Alternatively, a conductive contact is made between the underlying conductive element and the first interconnect layer through the remaining buffer layer if the buffer layer is made of a conductive film.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
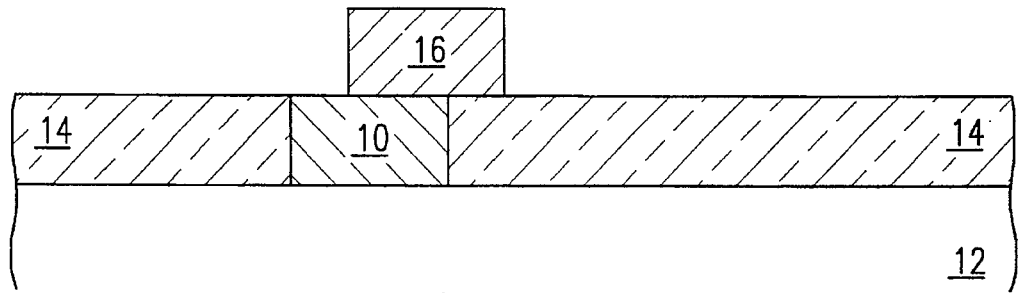
FIG. 1 is a cross sectional view of an integrated circuit illustrating a prior art structure and method for forming a contact structure in an integrated circuit.

FIG. 1 is a cross sectional view of an integrated circuit illustrating a prior art structure and method for forming a contact structure in an integrated circuit. A conductive plug 10 is formed on an underlying region 12 in an integrated circuit. The conductive plug 10 can be formed by several techniques. First, the conductive plug 10 may be formed by creating an opening in the insulating layer 14 and selectively depositing tungsten in the opening. Alternatively, the conductive plug 10 may be created by depositing aluminum over the insulating layer 14 and the opening, and then anisotropically etching back the aluminum. The purpose of the conductive plug 10 is to make electrical contact with a conductive element (not shown) in the underlying region A conductive layer is then deposited over the integrated circuit and patterned to define a first interconnect layer 16. Ideally, the first interconnect layer 16 should be formed directly above the conductive plug 10. Errors in mask alignment, however, can cause the first interconnect layer 16 to be formed over only a portion of the conductive plug 10, as shown in FIG. 1. Consequently, the conductive plug 10 can be damaged by the etch used to pattern the first interconnect layer 16. This damage can lead to reliability problems with the integrated circuit.

Figure 2:
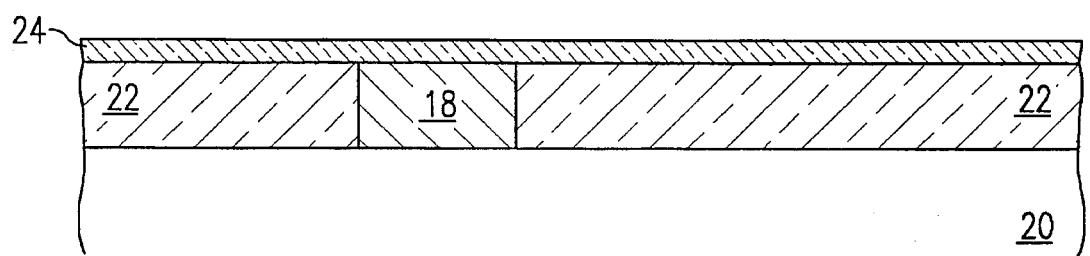
FIGS. 2–6 are cross sectional views of an integrated circuit illustrating a preferred structure and method for forming a contact structure in an integrated circuit.

FIGS. 2–6 are cross sectional views of an integrated circuit illustrating a preferred structure and method for forming a contact structure in an integrated circuit. Referring to FIG. 2, a conductive plug 18 is formed within an opening in an insulating layer 22 which overlies an underlying region 20 in an integrated circuit. The conductive plug 18 can be created using the methods described with reference to FIG. 1. In the preferred embodiment, the conductive plug 18 is made of a metal, and the insulating layer 22 is made of oxide. Those skilled in the art will recognize that other conductive materials may be used for the conductive plug 18, and other insulating materials may be used for the insulating layer 22.

A buffer layer 24 is then formed over the integrated circuit. In the preferred embodiment, the buffer layer is made of oxide or nitride, but other insulating materials may be used.

Figure 3:
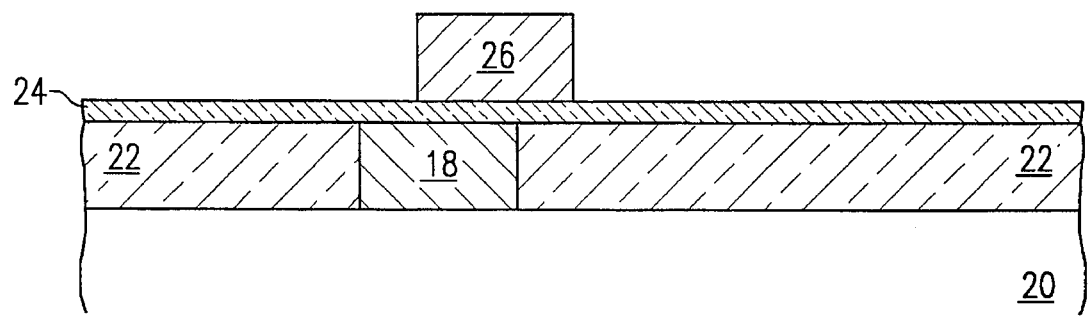
Figure 4:
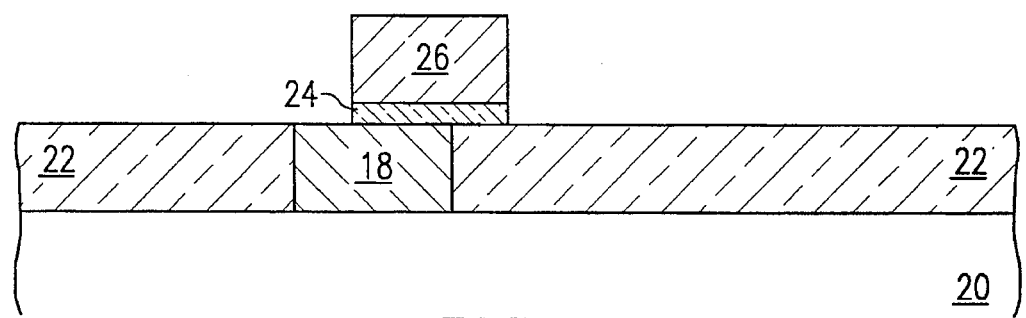

FIG. 3 illustrates the integrated circuit after a first conductive layer is deposited over the buffer layer and patterned to define a first interconnect layer 26. During patterning of the first interconnect layer 26, the buffer layer 24 acts as an etch stop and protects the conductive plug 18 from damage. Referring to FIG. 4, those portions of the buffer layer 24 which are not covered by the first interconnect layer 26 are etched away. This can be done by either an isotropic or anisotropic etch. As can be seen, a portion of the conductive plug 18 is purposely exposed by the etch. If an anisotropic etch is used to etch away the buffer layer 24, the exposed portion of the conductive plug 18 may be damaged. The damage, however, is minimized because the buffer layer 24 is thin.

Figure 5:
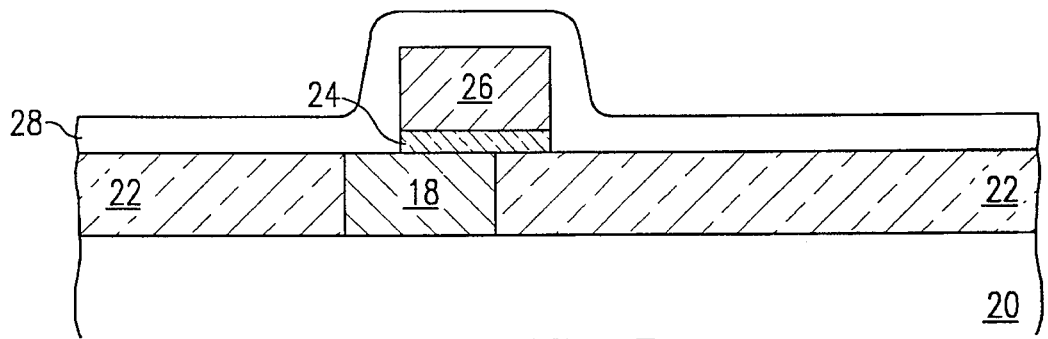

FIG. 5 illustrates the integrated circuit after a second conductive layer 28 is deposited over the integrated circuit. The second conductive layer 28 may be made of a metal or some other conductive material such as polycrystalline silicon.

Figure 6:
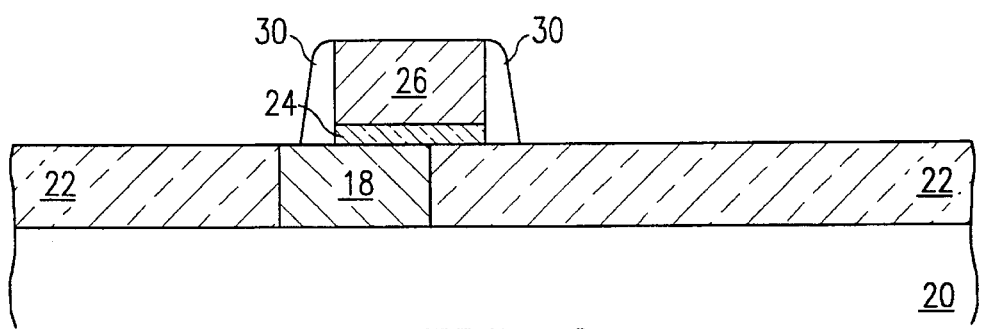

Referring to FIG. 6, the second conductive layer 28 is then anisotropically etched to form conductive sidewall spacers 30 alongside the vertical sidewalls of the first interconnect layer 26. At least one of the sidewall spacers 30 makes an electrical contact with the conductive plug 18. Therefore, a conductive contact is formed between the conductive plug 18 and the first interconnect layer 26 through one of the conductive sidewall spacers 30.

Figure 7:
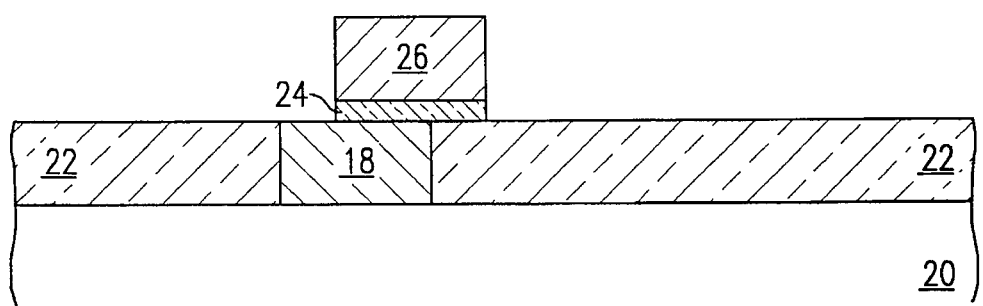
FIG. 7 is a cross sectional view of an integrated circuit illustrating an alternative preferred structure and method for forming a contact structure in an integrated circuit.

FIG. 7 is a cross sectional view of an integrated circuit illustrating an alternative preferred structure and method for forming a contact structure in an integrated circuit. The processing steps described with reference to FIGS. 2–4 are performed, with the buffer layer 24 being preferably made of amorphous silicon, polycrystalline silicon, metal, or some other conductive material instead of oxide or nitride. The buffer layer 24 formed between the conductive plug 18 and the first interconnect layer 26 forms a conductive contact between the conductive plug 18 and the first interconnect layer 26.

If desired, buffer layer 24 can be formed from an appropriate anti-fuse material, such as intrinsic polycrystalline silicon. At a later time, as known in the art, the anti-fuse layer can be blown to form a conductive contact between the conductive plug 18 and the first interconnect layer 26.

Figure 8:
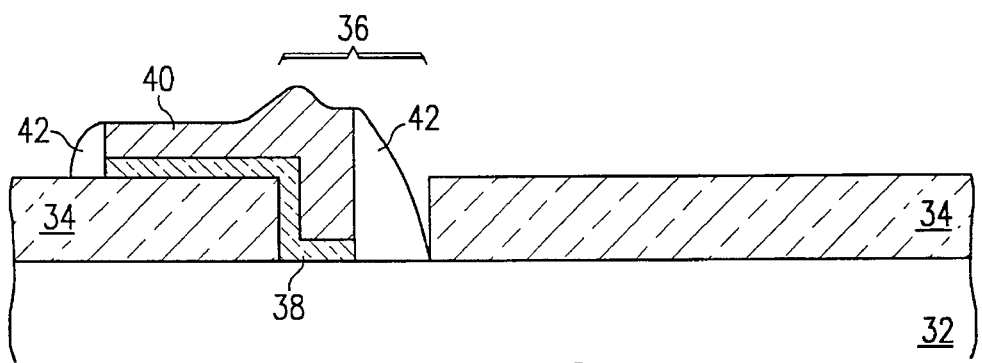
FIG. 8 is a cross sectional view of an integrated circuit illustrating another alternative preferred structure and method for forming a contact structure in an integrated circuit.

FIG. 8 is a cross sectional view of an integrated circuit illustrating another alternative preferred structure and method for forming a contact structure in an integrated circuit. A contact is to be formed over an underlying first conductive element 32 in an integrated circuit. The underlying first conductive element 32 is either a semiconductor substrate or an underlying interconnect layer. An insulating layer 34, typically made of oxide, deposited or grown over the integrated circuit. A contact via 36 is then formed in the insulating layer 34 to expose a portion of the underlying first conductive element 32.

A buffer layer 38 is deposited over the integrated circuit and extends into the contact via 36. The buffer layer 38 is can be made of either conductive or insulating materials. For example, the buffer layer can be made of nitride or polycrystalline silicon.

The processing steps described with reference to FIGS. 3–7 can be used to complete the contact structure illustrated in FIG. 8. The same materials can be used, as well as the fabrication techniques. For example, first interconnect layer 40 shown in FIG. 8 is similar to conductive plug 18, and sidewall spacers 42 are similar to sidewall spacers 30.

The methods described above provide a structure and method for forming contact structures which protects underlying contacts from damage during formation of overlying interconnect layers. The methods also eliminate the need for enclosures in interconnect layers.

While the invention has been particularly shown and described with reference to a preferred embodiment, it will be understood by those skilled in the art that various changes in form and detail may be made therein without departing from the spirit and scope of the invention.

What is claimed is:

1. A method for forming a contact structure in an integrated circuit, comprising the steps of:

forming an oxide insulating layer;

forming an opening in the oxide insulating layer;

forming a region of conductive material in the opening to define a conductive element;

forming an insulating buffer layer over the oxide layer and the conductive element;

depositing a first conductive layer over the buffer layer;

patterning the first conductive layer to define a first interconnect layer, wherein the buffer layer acts as an etch stop and protects the conductive element from damage;

removing portions of the buffer layer not covered by the first interconnect layer;

depositing a second conductive layer over the integrated circuit; and anisotropically etching the second conductive layer to form conductive sidewall spacers alongside the vertical sidewalls of the first interconnect layer, wherein at least one of the conductive sidewall spacers makes electrical contact with a portion of the conductive element.

2. The method of claim 1, wherein said step of forming a buffer layer comprises depositing a layer of nitride over the oxide layer and the conductive element.

3. The method of claim 1, wherein said step of depositing a first conductive layer comprises depositing a layer of metal over the buffer layer.

4. The method of claim 1, wherein said step of depositing a second conductive layer comprises depositing a layer of metal over the integrated circuit.

5. The method of claim 1, wherein said step of depositing a first conductive layer comprises depositing a layer of material which is not removed during said step of removing portions of the buffer layer.

6. The method of claim 5, wherein said second conductive layer comprises polycrystalline silicon.

7. The method of claim 5, wherein said second conductive layer comprises titanium nitride.

\* \* \* \* \*